(12) United States Patent
Wu

(10) Patent No.: US 12,340,720 B2
(45) Date of Patent: Jun. 24, 2025

(54) DISPLAY PANEL, DETECTION METHOD THEREOF, AND TILED DISPLAY SCREEN

(71) Applicant: Guangzhou China Star Optoelectronics Semiconductor Display Technology Co., LTd., Guangdong (CN)

(72) Inventor: Wei Wu, Guangdong (CN)

(73) Assignee: Guangzhou China Star Optoelectronics Semiconductor Display Technology Co., LTd., Guangzhou (CN)

( * ) Notice: Subject to any disclaimer, the term of this patent is extended or adjusted under 35 U.S.C. 154(b) by 0 days.

(21) Appl. No.: 18/523,686

(22) Filed: Nov. 29, 2023

(65) Prior Publication Data

US 2024/0355248 A1    Oct. 24, 2024

(30) Foreign Application Priority Data

Apr. 20, 2023   (CN) .......................... 202310430414.7

(51) Int. Cl.
| | |
|---|---|
| G09G 3/00 | (2006.01) |
| G09G 3/32 | (2016.01) |
| H01L 25/16 | (2023.01) |
| H01L 27/12 | (2006.01) |
| H10D 86/40 | (2025.01) |
| H10D 86/60 | (2025.01) |

(52) U.S. Cl.
CPC ............... *G09G 3/006* (2013.01); *G09G 3/32* (2013.01); *H01L 25/167* (2013.01); *H10D 86/441* (2025.01); *H10D 86/60* (2025.01); *G09G 2300/026* (2013.01); *G09G 2320/043* (2013.01)

(58) Field of Classification Search
CPC .... G09G 3/006; G09G 3/32; G09G 2300/026; G09G 2320/043; H01L 25/167; H01L 27/124

See application file for complete search history.

(56) References Cited

U.S. PATENT DOCUMENTS

| | | | |
|---|---|---|---|
| 2016/0190166 A1* | 6/2016 | Kim ..................... | H10D 86/481 257/71 |
| 2018/0166020 A1* | 6/2018 | Hwang ................ | G09G 3/3233 |
| 2021/0210000 A1* | 7/2021 | Lee ....................... | G09G 3/3233 |
| 2022/0319439 A1* | 10/2022 | Pyun ..................... | G09G 3/3233 |
| 2024/0178359 A1* | 5/2024 | Jang ........................ | H01L 33/32 |

* cited by examiner

*Primary Examiner* — Md Saiful A Siddiqui
(74) *Attorney, Agent, or Firm* — PV IP PC; Wei Te Chung

(57) ABSTRACT

A display panel, a detection method thereof, and a tiled display screen are provided. The display panel includes a driving backplane and a light-emitting device disposed on the display panel; wherein the driving backplane has a display area and a non-display area disposed at a periphery of the display area; the light-emitting device is disposed corresponding to the display area; a driving thin film transistor (TFT) and a detecting TFT are disposed in the display area of the driving backplane; and the driving backplane is further provided with a detecting gate wire and a detecting signal wire; wherein the detecting TFT includes a first gate, a first source and a first drain.

19 Claims, 2 Drawing Sheets

S100 — providing a display panel, wherein the display panel comprises a driving backplane and a light-emitting device disposed on the display panel; wherein the driving backplane comprises a display area and a non-display area disposed at a periphery of the display area; the light-emitting device is disposed corresponding to the display area; a driving thin film transistor (TFT) and a detecting TFT are disposed in the display area of the driving backplane; and the driving backplane is further provided with a detecting gate wire and a detecting signal wire; wherein the detecting TFT comprises a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area S200 — inputting an electrical signal into the first gate through the detecting gate wire, to conduct the first source and the first drain S300 — inputting a detection electrical signal into the first source through the detecting signal wire, and transmitting the detection electrical signal to the positive electrode of the light-emitting device through the first drain, to detect an electrical performance of the light-emitting device

FIG. 3

DISPLAY PANEL, DETECTION METHOD THEREOF, AND TILED DISPLAY SCREEN

CROSS-REFERENCE TO RELATED APPLICATION

This application claims priority to Chinese Patent Application No. 202310430414.7, filed on Apr. 20, 2023, the disclosure of which is incorporated herein by reference in its entirety.

TECHNICAL FIELD

The present disclosure relates to the field of display technologies, and in particular, to a display panel, a detection method thereof, and a tiled display screen.

BACKGROUND

Mini light-emitting diode (Mini-LED) display panels have various advantages such as high brightness, wide color gamut, high contrast, high-speed response, low power consumption, and long lifespan, and are considered the next generation of display solutions. Currently, there are two types of Mini-LED display panels. One type uses a printed circuit board (PCB) as a substrate, which has the advantage of high reliability and the disadvantage of limited precision. The other type uses a thin film transistor (TFT) substrate as a substrate (i.e., driving backplane), which has the advantage of high precision and can be directly made into indoor direct display screens for applications such as television (TV) and monitor (MNT).

Many processes are involved in the production of Mini-LED display panels by using TFT substrates as driving backplanes, and each process has a certain yield. In order to avoid defective products flowing back to a later stage process, which wastes the production capacity, materials, and labor costs of the later stage process, tests need to be carried out after each stage of the processes. A cell test after LED beads are transferred to the driving backplane is one of the important testing processes. In order to achieve the cell test, an edge area of the driving backplane of the display panel needs to be provided with multiple test wires connected to a switching TFT and a driving TFT. The test wires are usually metal wires. As the test wires can increase a width of a bezel of the display panel, the display effect of a tiled display screen formed by tiling multiple display panels is affected. Therefore, after the cell test, the area with test wires on the driving backplane is usually cut off to reduce the width of the bezel of the display panel. However, after cutting, edges of the display panel also have multiple sections of the test wires left. During the use of the display panel, water vapor in the environment can enter the driving backplane from the sections of the multiple test wires and penetrate into the driving backplane along directions of the test wires, thereby affecting the performance of the Mini-LED display panel and shortening the service life of the Mini-LED display panel.

SUMMARY

The present disclosure provides a display panel, a detection method thereof, and a tiled display screen, which can reduce the number of metal wires disposed in a non-display area of a driving backplane for achieving a cell test, thereby reducing the penetration of water vapor in the environment into the driving backplane along the metal wires, and thereby extending the service life of the display panel.

In a first aspect, an embodiment of the present disclosure provides a display panel, including a driving backplane and a light-emitting device disposed on the display panel; wherein the driving backplane includes a display area and a non-display area disposed at a periphery of the display area; the light-emitting device is disposed corresponding to the display area; a driving thin film transistor (TFT) and a detecting TFT are disposed in the display area of the driving backplane; and the driving backplane is further provided with a detecting gate wire and a detecting signal wire; wherein the detecting TFT includes a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area.

In some embodiments, the driving TFT includes a second gate, a second source and a second drain; the second drain is electrically connected to the positive electrode of the light-emitting device; and the first drain of the detecting TFT is connected to the second drain of the driving TFT, to detect a threshold voltage of the second gate of the driving TFT through the detecting TFT.

In some embodiments, a switching TFT is disposed in the display area of the driving backplane; the switching TFT includes a third gate, a third source and a third drain; and the third drain is connected to the second gate of the driving TFT, to control the driving TFT to turn on or off through the switching TFT.

In some embodiments, a storage capacitor is disposed in the display area of the driving backplane, and the storage capacitor includes a first storage electrode and a second storage electrode opposite to the first storage electrode; wherein the third drain is connected to the second gate through a first connection wire, the second drain of the driving TFT is connected to the positive electrode of the light-emitting device through a second connection wire, the first storage electrode is connected to the first connection wire, and the second storage electrode is connected to the second connection wire.

In some embodiments, a positive signal wire and a negative signal wire are disposed in the non-display area of the driving backplane, the positive signal wire is connected to the second source of the driving TFT, the negative signal wire is connected to a negative electrode of the light-emitting device, the positive signal wire is disposed in the display area, and the negative signal wire extends from the display area to the non-display area.

In a second aspect, an embodiment of the present disclosure provides a detection method of display panel, including: providing a display panel, wherein the display panel includes a driving backplane and a light-emitting device disposed on the display panel; wherein the driving backplane includes a display area and a non-display area disposed at a periphery of the display area; the light-emitting device is disposed corresponding to the display area; a driving thin film transistor (TFT) and a detecting TFT are disposed in the display area of the driving backplane; and the driving backplane is further provided with a detecting gate wire and a detecting signal wire; wherein the detecting TFT includes a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area; inputting an electrical signal into the first gate through the detecting gate wire, to conduct the first source and the first drain; and inputting a detection electrical signal into the first source through the detecting signal wire, and transmitting the detection electrical signal to the positive electrode of the light-emitting device through the first drain, to detect an electrical performance of the light-emitting device.

In some embodiments, the driving TFT includes a second gate, a second source and a second drain; the second drain is electrically connected to the positive electrode of the light-emitting device; and the first drain of the detecting TFT is connected to the second drain of the driving TFT, to detect a threshold voltage of the second gate of the driving TFT through the detecting TFT.

In some embodiments, a switching TFT is disposed in the display area of the driving backplane; the switching TFT includes a third gate, a third source and a third drain; and the third drain is connected to the second gate of the driving TFT, to control the driving TFT to turn on or off through the switching TFT.

In some embodiments, a storage capacitor is disposed in the display area of the driving backplane, and the storage capacitor includes a first storage electrode and a second storage electrode opposite to the first storage electrode; wherein the third drain is connected to the second gate through a first connection wire, the second drain of the driving TFT is connected to the positive electrode of the light-emitting device through a second connection wire, the first storage electrode is connected to the first connection wire, and the second storage electrode is connected to the second connection wire.

In a third aspect, an embodiment of the present disclosure provides a tiled display screen, the tiled display screen includes at least two display panels tiled together, and the display panel are mentioned above.

According to the display panel provided by the embodiment of the present disclosure, the detecting TFT is connected with the light-emitting device, and the detection electrical signal is input into the positive electrode of the light-emitting device through the detecting signal wire, to detect the electrical performance of the light-emitting device. As such, the detecting TFT can not only detect the electrical performance of the driving TFT, but also detect the electrical performance of the light-emitting device. Therefore, the detecting gate wire, the detecting signal wire, and detecting TFT can be used to achieve the cell test of the display panel. Compared with the existing display panel, the display panel of the embodiment of the present disclosure does not use the switching TFT and the driving TFT to achieve the cell test of the display panel, but uses the detecting TFT and the original signal transmission wires (the detecting gate wire and the detecting signal wire) of the detecting TFT to achieve the cell test of the display panel, thereby reducing the number of metal wires extend to the non-display area for the cell test. As such, when the non-display area of the display panel is cut after the cell test, the number of the sections of the metal wires remaining on the cutting surface of the display panel can be reduced, thereby reducing the penetration of water vapor in the environment into the driving backplane along the metal wires and extending the service life of the display panel. Moreover, when the number of the metal wires in the non-display area decreases, the area of the non-display area of the driving backplane is reduced, thereby reducing the width of bezel of the display panel, which is conducive to achieving a narrow bezel display of the display panel.

BRIEF DESCRIPTION OF THE DRAWINGS

In order to provide a clearer explanation of the technical solutions in the embodiments of the present disclosure, a brief description is given below to the accompanying drawings required in the description of the embodiments.

FIG. 3 illustrates a flowchart of a detection method of display panel according to an embodiment of the present disclosure.

DETAILED DESCRIPTION OF THE EMBODIMENTS

Technical solutions in the embodiments of the present disclosure will be clearly and completely described below with reference to the accompanying drawings. The described embodiments are only some of the embodiments of the present disclosure, not all of them. Based on the embodiments in the present disclosure, all other embodiments obtained by those skilled in the art without making creative efforts fall in the scope of protection of the present disclosure.

Figure 1:
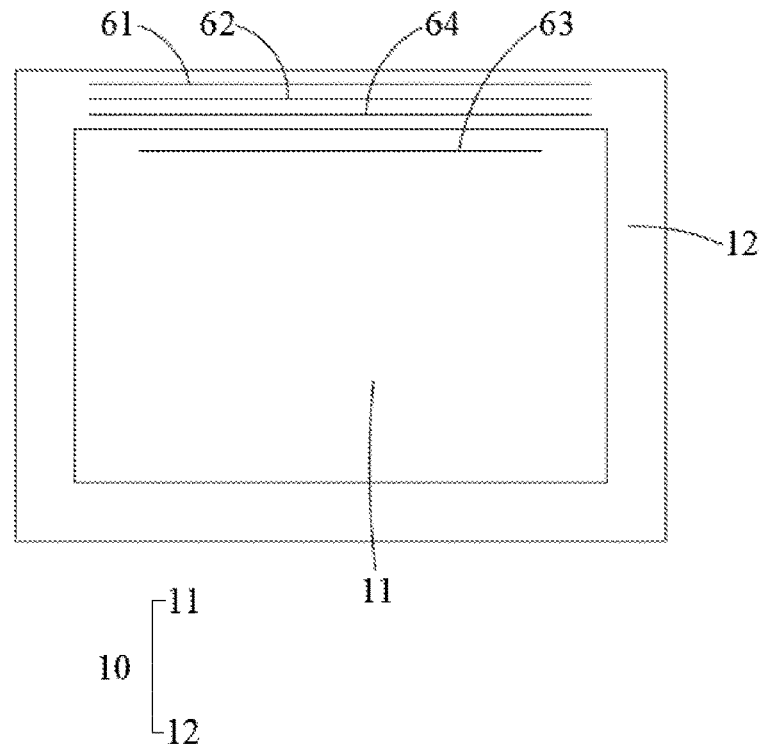
FIG. 1 illustrates a structural schematic diagram of a display panel according to an embodiment of the present disclosure.
Figure 2:
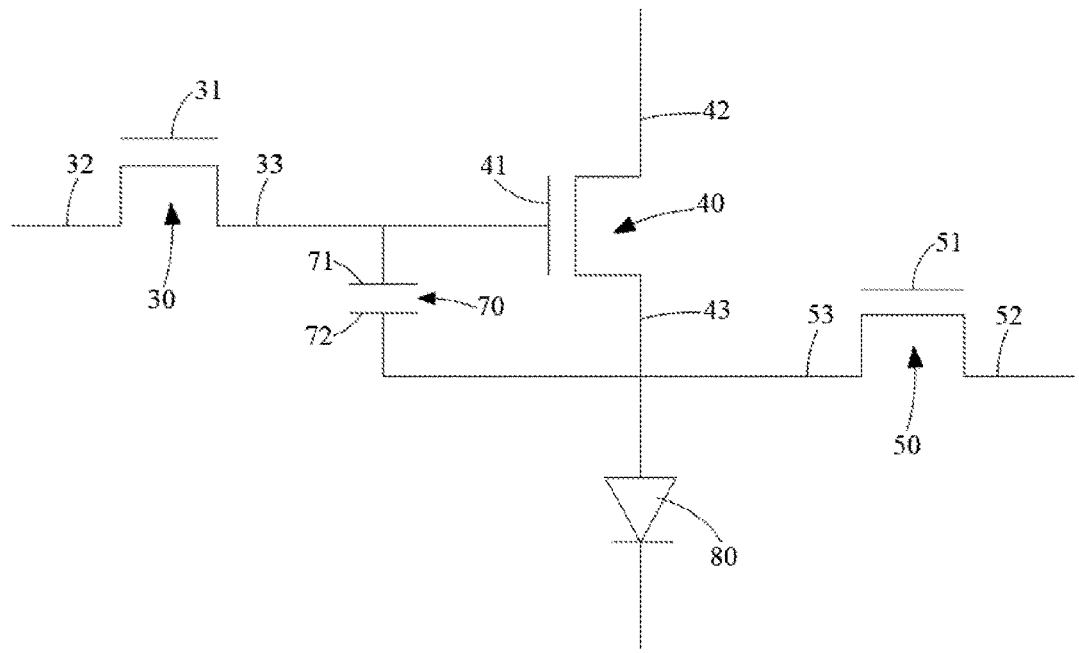
FIG. 2 illustrates a schematic diagram of a connection relationship among a switch TFT, a driving TFT and a detecting TFT according to an embodiment of the present disclosure.

Referring to FIG. 1 to FIG. 2, a display panel 100 is provided according to an embodiment of the present disclosure. The display panel 100 includes a driving backplane 10 and a light-emitting device 80 disposed on the driving backplane 10. The driving backplane 10 includes a display area 11 and a non-display area 12 disposed at a periphery of the display area 11. The light-emitting device 80 is disposed corresponding to the display area 11, a driving TFT 40 and a detecting TFT 50 are disposed in the display area 11 of the driving backplane 10. The driving TFT 40 is used to control the light-emitting device 80 to turn on or off when the display panel 100 displays a picture, and the detecting TFT 50 is used to detect an electrical performance of the driving TFT 40. The driving backplane 10 is further provided with a detecting gate wire 61 and a detecting signal wire 62. The detecting TFT 50 includes a first gate 51, a first source 52 and a first drain 53, the first drain 53 is electrically connected to a positive electrode of the light-emitting device 80, the detecting gate wire 61 is connected to the first gate 51, the detecting signal wire 62 is connected to the first source 52, and the detecting signal wire 62 can be used to input a detection electrical signal into the positive electrode of the light-emitting device 80 to detect the electrical performance of the light-emitting device 80. The detecting gate wire 61 and the detecting signal wire 62 both extend from the display area 11 to the non-display area 12.

In an embodiment, the electrical performance of the light-emitting device 80 can refer to whether the light-emitting device 80 can turn on normally, whether a luminous performance of the light-emitting device 80 is stable, and whether a brightness of the light-emitting device 80 meets the requirements.

In an embodiment, the light-emitting device 80 can be a Mini-LED.

The display panel 100 provided by the embodiment of the present disclosure can use the detecting gate wire 61 to input the electrical signal to the first gate 51 by electrically connecting the detecting TFT 50 with the light-emitting device 80, to control the turning-on and turning-off of the detecting TFT 50. In addition, the display panel 100 can use the detecting signal wire 62 to input the detection electrical signal into the positive electrode of the light-emitting device 80 to detect the electrical performance of the light-emitting device 80, as such, the detecting TFT 50 can not only detect the electrical performance of the driving TFT 40, but also detect the electrical performance of the light-emitting device 80. Therefore, the detecting gate wire 61, the detecting signal wire 62, and the detecting TFT 50 can be used to achieve the cell test of the display panel 100.

Referring to FIG. 2, the existing display panels use a switching TFT 30 and the driving TFT 40 to achieve the cell test, that is, the switching TFT 30 is used to control the turning-on and the turning-off of the driving TFT 40, and then voltages of the second gate 41 and the second source 72 of the driving TFT 40 are controlled, to control the turning-on and the turning-off of the light-emitting device 80, as well as a brightness of the turned on light-emitting device 80. Moreover, relevant test wires need to be disposed in the non-display area 12 of the driving backplane 10 to input the electrical signal into the switching TFT 30 and the driving TFT 40. The relevant test wires include multiple test signal wires (including a first signal wire for controlling turning-on, turning-off and brightness of a red LED, a second signal wire for controlling turning-on, turning-off and brightness of a green LED, and a third signal wire for controlling turning-on, turning-off and brightness of a blue LED) for inputting signals into the third source 32 of the switching TFT 30, a test gate wire for inputting the electrical signals into the third gate 31 of the switching TFT 30, the detecting signal wire 62 for inputting the electrical signals into the first source 52 of the detecting TFT 50, the detecting gate wire 61 for inputting the signals into the first gate 51 of the detecting TFT 50, a positive signal wire 63 for inputting the signals into the second source 42 of the driving TFT 40, and a negative signal wire 64 for inputting the electrical signals into the negative electrode of the light-emitting device 80. It can be found that at least eight metal wires related to the cell test need to be disposed in the non-display area 12 of the driving backplane 10. It can be understood that when too many metal wires are disposed in the non-display area 12 of the driving backplane 10 and the non-display area 12 of the display panel 100 is cut after the cell test, a large number of sections of metal wires on the cutting surface of the display panel remained. At this point, water vapor in the environment is prone to penetrate into the driving backplane 10 along with the directions of the metal wires, causing electronic elements inside the driving backplane 10 to fail. In addition, a large number of the metal wires can increase the area of the non-display area 12 of the driving backplane 10, resulting in a wider bezel of the display panel 100 and difficulty in achieving a narrow bezel display.

The display panel 100 provided by the embodiment of the present disclosure does not use the switching TFT 30 and the driving TFT 40 to achieve the cell test of the display panel 100, but uses the detecting TFT 50 and the original signal transmission wires (the detecting gate wire 61 and the detecting signal wire 62) of the detecting TFT 50 to achieve the cell test of the display panel 100. Compared with the existing display panel, the display panel 100 provided by the present disclosure can save at least four cell test signal wires (a first signal wire, a second signal wire, a third signal wire, and a test gate wire), thereby significantly reducing the number of metal wires extending to the non-display area 12 of the driving backplane 10. When the non-display area 12 of the display panel 100 is cut after the cell test, the number of the sections of the residual metal wires on the cutting surface of the display panel 100 can be reduced, thereby reducing the penetration of water vapor in the environment into the driving backplane 10 along the metal wires and extending the service life of the display panel 100. Moreover, when the number of the metal wires in the non-display area 12 decreases, the area of the non-display area 12 of the driving backplane 10 is reduced, thereby reducing the width of the bezel of the display panel 100, which is conducive to achieving narrow bezel display of the display panel 100.

Referring to FIG. 2, the driving TFT 40 includes a second gate 41, a second source 42 and a second drain 43, and the second drain 43 is electrically connected to the positive electrode of the light-emitting device 80. The first drain 53 of the detecting TFT 50 is connected to the second drain 43 of the driving TFT, as such the detecting TFT 50 is capable of detecting a threshold voltage of the second gate 41 of the driving TFT 40. Since multiple driving TFTs 40 are disposed in the driving backplane 10 and the threshold voltages of the driving TFTs 40 may deviate, therefore, it is necessary to monitor the threshold voltage of each driving TFT 40, and thereafter compensating the electrical signal inputted to the source of each driving TFT 40 according to a difference of the threshold voltage on driving TFTs 40, to ensure that the current between the source and the drain of each driving TFT 40 remains consistent under the same gate driving voltage.

It should be noted that a working principle of using the detecting TFT 50 to detect the threshold voltage of the second gate 41 of the driving TFT 40 is as follows: the switching TFT 30 is turned on, then a high potential voltage Vdata_H is input into the second gate 41 of the driving TFT 40 through the third drain 33 of the switching TFT 30, to turn on the driving TFT 40; and at this time, a voltage Vg of the second gate 41 of the driving TFT 40 is equal to Vdata_H; afterwards, the detecting TFT 50 is turned on and the voltage is input to the second drain 43 of the driving TFT 40 through the first drain 53 of the detecting TFT 50; when a voltage Vs of the second drain 43 of the driving TFT 40 is equal to Vdata_H−Vth, the detecting TFT 50 is turned off, where Vth is a threshold voltage of the second gate 41 of the driving TFT 40. Therefore, the threshold voltage of the second gate 41 can be obtained based on the equation of Vth=Vs−Vdata_H.

Referring to FIG. 1 to FIG. 2, the switching TFT 30 is disposed in the display area 11 of the driving backplane 10, the switching TFT 30 includes a third gate 31, a third source 32 and a third drain 33, and the third drain 33 is connected to the second gate 41 of the driving TFT 40. As such, the switching TFT 30 is capable of controlling the driving TFT 40 to turn on or off.

Referring to FIG. 1 to FIG. 2, a storage capacitor 70 is disposed in the display area 11 of the driving backplane 10, the storage capacitor 70 includes a first storage electrode 71 and a second storage electrode 72 opposite to the first storage electrode. The third drain 33 is connected to the second gate 41 through a first connection wire, the second drain 43 of the driving TFT 40 is connected to the positive electrode of the light-emitting device 80 through a second connection wire, the first storage electrode 71 is connected to the first connection wire, and the second storage electrode 72 is connected to the second connection wire. It should be understood that the storage capacitor 70 can be used to charge the second gate 41 of the driving TFT 40, therefore, the driving TFT 40 can remain the turning-on state for a certain period of time after the power outgo.

Referring to FIG. 1 to FIG. 2, a positive signal wire 63 and a negative signal wire 64 are disposed in the driving backplane 10, the positive signal wire 63 is connected to the second source 42 of the driving TFT 40, to input the electrical signal into the positive electrode of the light-emitting device 80. The negative signal wire 64 is connected to the negative electrode of the light-emitting device 80, to input the electrical signal into the negative electrode of the light-emitting device 80. The positive signal wire 63 is disposed in the display area 11, and the negative signal wire 64 extends from the display area 11 to the non-display area 12.

It should be noted that the positive signal wire 63 is not the wire required for the cell test, but the signal conduction wire is required for the normal operation of the display panel 100. It can be understood that when the display panel 100 is working normally, the switching TFT 30 and the driving TFT 40 are used to control the turning-on, turning-off, and the brightness of the light-emitting device 80 when the light-emitting device 80 is turned on. That is, the switching TFT 30 can be used to control the turning-on and turning-off of the driving TFT 40, and then the turning-on and the turning-off of the light-emitting device 80, as well as the brightness of the light-emitting device 80 when the light-emitting device 80 is turned on are controlled by controlling the voltages of the second gate 41 and the second source 42 of the driving TFT 40.

It should be understood that according to the present disclosure, since the positive signal wire 63 is disposed in the display area 11, that is to say, when the non-display area 12 of the display panel 100 is cut after the cell test, the sections of the positive signal wire 63 cannot remain on the cutting surface of the edges of the display panel 100. However, in the existing art, due to the use of the switching TFT 30 and the driving TFT 40 for the cell test, which means that the positive signal wire 63 is a necessary test wire for the cell test. Therefore, in the existing art, the positive signal wire 63 needs to be extended to the non-display area 12, when the non-display area 12 of the display panel 100 is cut after the cell test of the display panel 100, the sections of the positive signal wire 63 is formed on the cutting surface of the edges of the display panel 100. It can be found that, compared with the existing art, the embodiment of the present disclosure can reduce the number of the sections of the residual metal wires on the cutting surface of the display panel 100 by disposing the positive signal wire 63 in the display area 11, thereby reducing the penetration of water vapor in the environment into the driving backplane 10 along the metal wires, and thus extending the service life of the display panel 100.

Referring to FIG. 1 to FIG. 3, the present disclosure provides a detection method of display panel, the display panel 100 is any one of the display panels mentioned above, and the detection method of display panel includes the following steps.

S100, referring to FIG. 1 and FIG. 2, the display panel 100 is provided. The display panel 100 includes a driving backplane 10 and a light-emitting device 80 disposed on the display panel 10. The driving backplane 10 includes a display area 11 and a non-display area 12 disposed at a periphery of the display area 11. The light-emitting device 80 is disposed corresponding to the display area 11, and a driving TFT 40 and a detecting TFT 50 are disposed in the display area 11 of the driving backplane 10. The driving TFT 40 is used to control the light-emitting device 80 to turn on or off when the display panel 100 displays a picture, and the detecting TFT 50 is used to detect the electrical performance of the driving TFT 40. The driving backplane 10 is further provided with a detecting gate wire 61 and a detecting signal wire 62 in the non-display area 12. The detecting TFT 50 includes a first gate 51, a first source 52 and a first drain 53, the first drain 53 is electrically connected to a positive electrode of the light-emitting device 80, the detecting gate wire 61 is connected to the first gate 51, and the detecting signal wire 62 is connected to the first source 52. The detecting gate wire 61 and the detecting signal wire 62 both extend from the display area 11 to the non-display area 12.

S200, referring to FIG. 1 and FIG. 2, an electrical signal is input into the first gate 51 by the detecting gate wire 61, to conduct the first source 52 and the first drain 53.

S300, referring to FIG. 1 and FIG. 2, a detection electrical signal is input into the first source 52 by the detecting signal wire 62, and the detection electrical signal is transmitted to the positive electrode of the light-emitting device 80 through the first drain 53, to detect an electrical performance of the light-emitting device 80.

Referring to FIG. 2, the driving TFT 40 includes a second gate 41, a second source 42 and a second drain 43, the second drain 43 is electrically connected to the positive electrode of the light-emitting device 80, and the first drain 53 of the detecting TFT 50 is connected to the second drain 43 of the driving TFT, to detect a threshold voltage of the second gate 41 of the driving TFT 40 by the detecting TFT 50.

Referring to FIG. 1 to FIG. 2, a switching TFT 30 is disposed in the display area 11 of the driving backplane 10, the switching TFT 30 includes a third gate 31, a third source 32 and a third drain 33, and the third drain 33 is connected to the second gate 41 of the driving TFT 40, to control the driving TFT 40 to turn on or off by the switching TFT 30.

Referring to FIG. 1 to FIG. 2, a storage capacitor 70 is disposed in the display area 11 of the driving backplane 10, the storage capacitor 70 includes a first storage electrode 71 and a second storage electrode 72 opposite to the first storage electrode 71. The third drain 33 is connected to the second gate 41 through a first connection wire, the second drain 43 of the driving TFT 40 is connected to the positive electrode of the light-emitting device 80 through a second connection wire, the first storage electrode 71 is connected to the first connection wire, and the second storage electrode 72 is connected to the second connection wire.

Referring to FIG. 1 to FIG. 2, a positive signal wire 63 and a negative signal wire 64 are disposed in the driving backplane 10, the positive signal wire 63 is connected to the second source 42 of the driving TFT 40, to input the electrical signal into the positive electrode of the light-emitting device 80. The negative signal wire 64 is connected to the negative electrode of the light-emitting device 80, to input the electrical signal into the negative electrode of the light-emitting device 80.

The embodiment of the present disclosure provides a tiled display screen, the tiled display screen includes at least two display panels 100 tiled together, and the display panel 100 is any one of the display panels 100 mentioned above.

The above provides a detailed description to a display panel, a detection method thereof, and a tiled display screen provided in the embodiments of present disclosure. In the present disclosure, specific examples have been applied to explain the principles and implementation methods of the present disclosure, and the explanations of the above embodiments are only used to help understand the present disclosure. In addition, for those skilled in the art, there may be changes in the specific implementation methods and application scope based on the ideas of the present disclosure. In summary, the content of this specification should not be understood as a limitation of the present disclosure.

What is claimed is:

1. A display panel, comprising: a driving backplane and a light-emitting device disposed on the display panel;

wherein the driving backplane comprises a display area and a non-display area disposed at a periphery of the display area; the light-emitting device is disposed corresponding to the display area; a driving thin film transistor (TFT) and a detecting TFT for detecting electrical performances of both the light-emitting device and the driving TFT are disposed in the display area of the driving backplane; and the driving backplane is further provided with a detecting gate wire and a detecting signal wire;

wherein the detecting TFT comprises a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area;

wherein a positive signal wire is disposed in the driving backplane, the positive signal wire is connected to a second source of the driving TFT, and the positive signal wire is disposed in the display area and not in the non-display area.

2. The display panel of claim 1, wherein the driving TFT comprises a second gate, a second source and a second drain; the second drain is electrically connected to the positive electrode of the light-emitting device; and the first drain of the detecting TFT is connected to the second drain of the driving TFT, to detect a threshold voltage of the second gate of the driving TFT through the detecting TFT.

3. The display panel of claim 2, wherein a switching TFT is disposed in the display area of the driving backplane; the switching TFT comprises a third gate, a third source and a third drain; and the third drain is connected to the second gate of the driving TFT, to control the driving TFT to turn on or off through the switching TFT.

4. The display panel of claim 3, wherein a storage capacitor is disposed in the display area of the driving backplane, and the storage capacitor comprises a first storage electrode and a second storage electrode opposite to the first storage electrode; wherein the third drain is connected to the second gate through a first connection wire, the second drain of the driving TFT is connected to the positive electrode of the light-emitting device through a second connection wire, the first storage electrode is connected to the first connection wire, and the second storage electrode is connected to the second connection wire.

5. The display panel of claim 2, wherein negative signal wire is disposed in the driving backplane, the negative signal wire is connected to a negative electrode of the light-emitting device, and the negative signal wire extends from the display area to the non-display area.

6. The display screen of claim 1, wherein the detecting gate wire is used to input an electrical signal to the first gate to control the turning-on and turning-off of the detecting TFT, and the detecting signal wire is used to input a detection electrical signal into the positive electrode of the light-emitting device to detect the electrical performance of the light-emitting device.

7. A detection method of display panel, comprising:

providing a display panel, wherein the display panel comprises a driving backplane and a light-emitting device disposed on the display panel; wherein the driving backplane comprises a display area and a non-display area disposed at a periphery of the display area; the light-emitting device is disposed corresponding to the display area; a driving thin film transistor (TFT) and a detecting TFT for detecting electrical performances of both the light-emitting device and the driving TFT are disposed in the display area of the driving backplane; and the driving backplane is further provided with a detecting gate wire and a detecting signal wire; wherein the detecting TFT comprises a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area;

inputting an electrical signal into the first gate through the detecting gate wire, to turn on the detecting TFT to conduct the first source and the first drain of the detecting TFT; and inputting a detection electrical signal into the first source through the detecting signal wire, and transmitting the detection electrical signal to the positive electrode of the light-emitting device through the first drain, to detect an electrical performance of the light-emitting device;

wherein a positive signal wire is disposed in the driving backplane, the positive signal wire is connected to a second source of the driving TFT, and the positive signal wire is disposed in the display area and not in the non-display area.

8. The detection method of display panel of claim 7, wherein the driving TFT comprises a second gate, a second source and a second drain; the second drain is electrically connected to the positive electrode of the light-emitting device; and the first drain of the detecting TFT is connected to the second drain of the driving TFT, to detect a threshold voltage of the second gate of the driving TFT through the detecting TFT.

9. The detection method of display panel of claim 8, wherein a switching TFT is disposed in the display area of the driving backplane; the switching TFT comprises a third gate, a third source and a third drain; and the third drain is connected to the second gate of the driving TFT, to control the driving TFT to turn on or off through the switching TFT.

10. The detection method of display panel of claim 9, wherein a storage capacitor is disposed in the display area of the driving backplane, and the storage capacitor comprises a first storage electrode and a second storage electrode opposite to the first storage electrode; wherein the third drain is connected to the second gate through a first connection wire, the second drain of the driving TFT is connected to the positive electrode of the light-emitting device through a second connection wire, the first storage electrode is connected to the first connection wire, and the second storage electrode is connected to the second connection wire.

11. The detection method of display panel of claim 9, wherein the cell test of the display panel is achieved by using the detecting gate wire, the detecting signal wire, and the detecting TFT, but without using a plurality of test signal wires for inputting signals into the third source of the switching TFT and a test gate wire for inputting electrical signals into the third gate of the switching TFT.

12. The detection method of display panel of claim 11, wherein the plurality of test signal wires comprises a first signal wire for controlling a red LED, a second signal wire for controlling a green LED, and a third signal wire for controlling a blue LED.

13. The detection method of display panel of claim 9, wherein a high potential voltage Vdata_H is input into the second gate of the driving TFT through the third drain of the switching TFT.

14. A tiled display screen, comprising at least two display panels tiled together, wherein each of the at least two display panels comprises a driving backplane and a light-emitting device disposed on the display panel; wherein the driving backplane comprises a display area and a non-display area disposed at a periphery of the display area; the light-emitting device is disposed corresponding to the display area; a driving thin film transistor (TFT) and a detecting TFT for detecting electrical performances of both the light-emitting device and the driving TFT are disposed in the display area of the driving backplane; and the driving backplane is further provided with a detecting gate wire and a detecting signal wire; wherein the detecting TFT comprises a first gate, a first source and a first drain; the first drain is electrically connected to a positive electrode of the light-emitting device; the detecting gate wire is connected to the first gate; the detecting signal wire is connected to the first source; and the detecting gate wire and the detecting signal wire both extend from the display area to the non-display area;
  wherein a positive signal wire is disposed in the driving backplane, the positive signal wire is connected to a second source of the driving TFT, and the positive signal wire is disposed in the display area and not in the non-display area.

15. The tiled display screen of claim 14, wherein the driving TFT comprises a second gate, a second source and a second drain; the second drain is electrically connected to the positive electrode of the light-emitting device; and the first drain of the detecting TFT is connected to the second drain of the driving TFT, to detect a threshold voltage of the second gate of the driving TFT through the detecting TFT.

16. The tiled display screen of claim 15, wherein a switching TFT is disposed in the display area of the driving backplane; the switching TFT comprises a third gate, a third source and a third drain; and the third drain is connected to the second gate of the driving TFT, to control the driving TFT to turn on or off through the switching TFT.

17. The tiled display screen of claim 16, wherein a storage capacitor is disposed in the display area of the driving backplane, and the storage capacitor comprises a first storage electrode and a second storage electrode opposite to the first storage electrode; wherein the third drain is connected to the second gate through a first connection wire, the second drain of the driving TFT is connected to the positive electrode of the light-emitting device through a second connection wire, the first storage electrode is connected to the first connection wire, and the second storage electrode is connected to the second connection wire.

18. The tiled display screen of claim 15, wherein a negative signal wire is disposed in the driving backplane, the negative signal wire is connected to a negative electrode of the light-emitting device, and the negative signal wire extends from the display area to the non-display area.

19. The tiled display screen of claim 15, wherein a negative signal wire is disposed in the driving backplane, the negative signal wire is connected to a negative electrode of the light-emitting device, and the negative signal wire extends from the display area to the non-display area.

* * * * *